United States Patent
Sakai et al.

(10) Patent No.: US 9,858,973 B2
(45) Date of Patent: Jan. 2, 2018

(54) VARIABLE CHANGE MEMORY AND THE WRITING METHOD OF THE SAME

(71) Applicant: TOSHIBA MEMORY CORPORATION, Minato-ku, Tokyo (JP)

(72) Inventors: Shintaro Sakai, Seoul (KR); Masahiko Nakayama, Kawasaki Kanagawa (JP); Katsuyuki Fujita, Nishitokyo Tokyo (JP); Hiromi Noro, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,771

(22) Filed: Sep. 9, 2016

(65) Prior Publication Data

US 2016/0379697 A1    Dec. 29, 2016

Related U.S. Application Data

(63) Continuation of application No. PCT/JP2014/074755, filed on Sep. 11, 2014.
(Continued)

(51) Int. Cl.
    *G11C 11/00*    (2006.01)
    *G11C 11/16*    (2006.01)
    (Continued)

(52) U.S. Cl.
    CPC ........ *G11C 11/161* (2013.01); *G11C 11/1655* (2013.01); *G11C 11/1673* (2013.01);
    (Continued)

(58) Field of Classification Search
    CPC .............. G11C 11/161; G11C 11/1655; G11C 11/1673; G11C 11/1675
    (Continued)

(56) References Cited

U.S. PATENT DOCUMENTS 7,903,448 B2 * 3/2011 Oh ..................... G11C 13/0007
                                                365/148
8,130,535 B2 * 3/2012 Rao .................. G11C 29/12015
                                                365/158
(Continued)

FOREIGN PATENT DOCUMENTS

JP    2002093149 A    3/2002
JP    2009200260 A    9/2009
(Continued)

OTHER PUBLICATIONS

Taiwanese Office Action dated Nov. 27, 2015 (and English translation thereof) issued in counterpart Taiwanese Application No. 103131672.
(Continued)

*Primary Examiner* — Anthan Tran
(74) *Attorney, Agent, or Firm* — Holtz, Holtz & Volek PC

(57) ABSTRACT

According to one embodiment, a variable change memory includes a bit line, a word line, a memory cell array, a resonance line, a clock generator, and a write driver. The bit line extends in a first direction. The word line extends in a second direction. The memory cell array includes blocks. The each block includes memory cells including a transistor and a variable resistive element. The resonance line connects to a bit line. The clock generator is arranged in the memory cell array and applies a voltage to the resonance line. The write driver supplies a write current to the bit line. The voltage oscillates at the predetermined period and the write current are supplied to the bit line.

6 Claims, 8 Drawing Sheets

Related U.S. Application Data

(60) Provisional application No. 61/952,649, filed on Mar. 13, 2014.

(51) Int. Cl.
 *G11C 13/00*  (2006.01)
 *H01L 27/22*  (2006.01)
 *H01L 43/08*  (2006.01)
 *H01L 43/10*  (2006.01)

(52) U.S. Cl.
 CPC ...... *G11C 11/1675* (2013.01); *G11C 11/1693* (2013.01); *G11C 13/0026* (2013.01); *G11C 13/0061* (2013.01); *G11C 13/0069* (2013.01); *H01L 27/228* (2013.01); *H01L 43/08* (2013.01); *H01L 43/10* (2013.01); *G11C 2013/0076* (2013.01); *G11C 2213/78* (2013.01); *G11C 2213/79* (2013.01)

(58) Field of Classification Search
 USPC ................................................ 365/158, 148
 See application file for complete search history.

(56) References Cited

U.S. PATENT DOCUMENTS

| | | | |
|---|---|---|---|
| 2002/0001225 A1 | 1/2002 | Poechmueller | |
| 2012/0020141 A1 | 1/2012 | Kitagawa et al. | |
| 2012/0111952 A1 | 5/2012 | Cao et al. | |
| 2013/0181305 A1* | 7/2013 | Nakayama | G11C 11/16 257/421 |
| 2014/0112055 A1 | 4/2014 | Kawahara et al. | |

FOREIGN PATENT DOCUMENTS

| | | |
|---|---|---|
| JP | 2009245500 A | 10/2009 |
| JP | 2012094201 A | 5/2012 |
| TW | 201216281 A | 4/2012 |
| WO | 2013080511 A1 | 6/2013 |

OTHER PUBLICATIONS

International Preliminary Report on Patentability (IPRP) and Written Opinion dated Sep. 22, 2016, issued in a counterpart International Application No. PCT/JP2014/074755.

International Search Report (ISR) and Written Opinion dated Nov. 25, 2014 issued in International Application No. PCT/JP2014/074755.

* cited by examiner

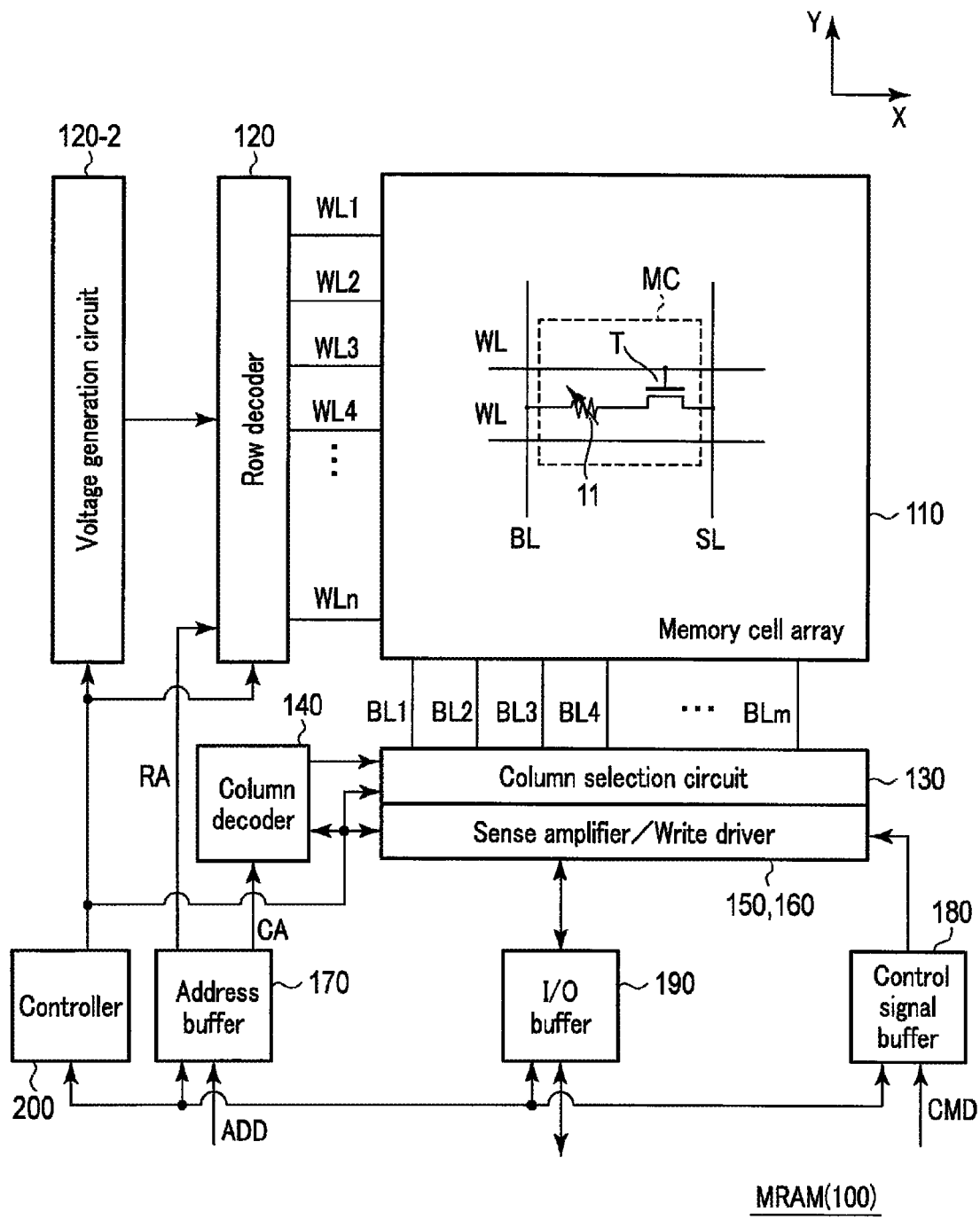
F I G. 1

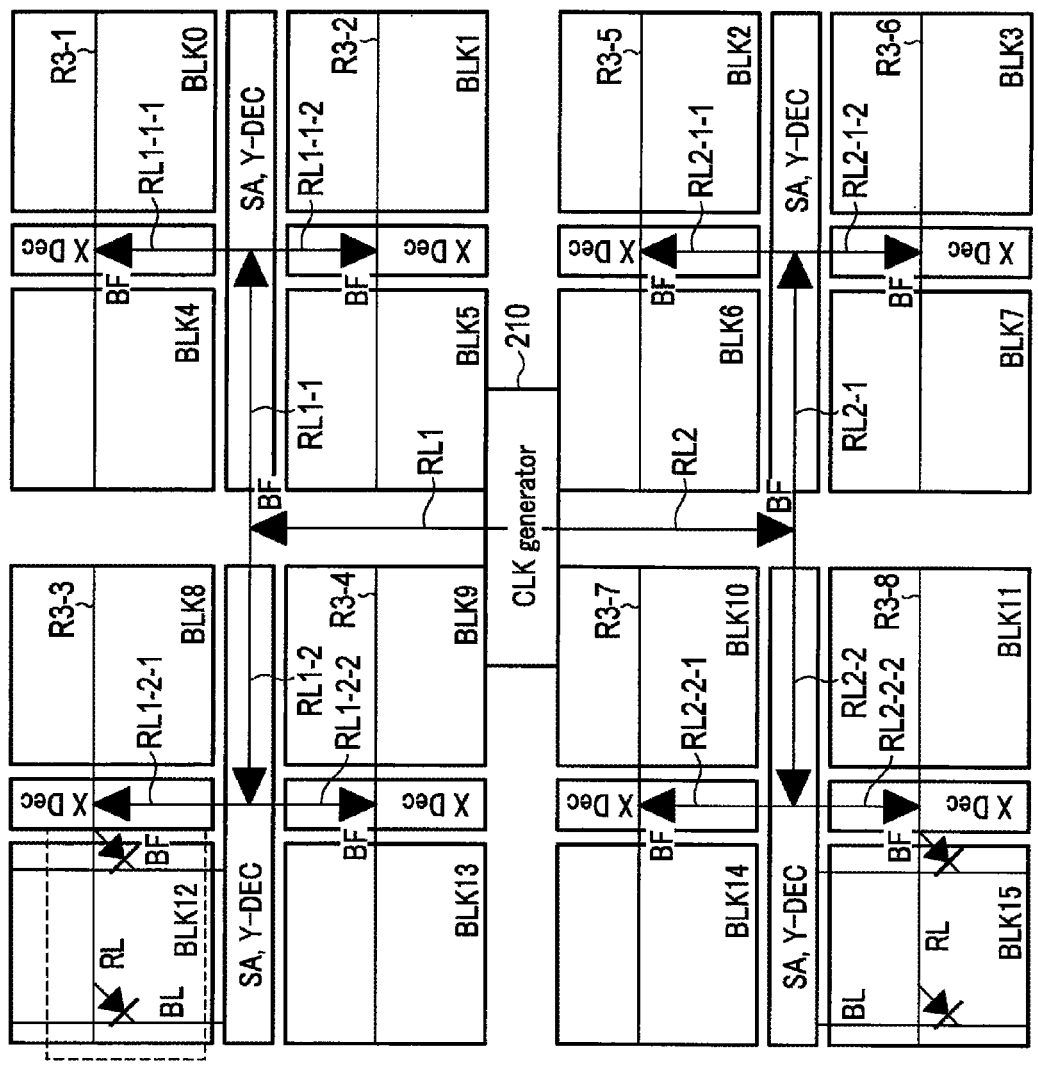
F I G. 2

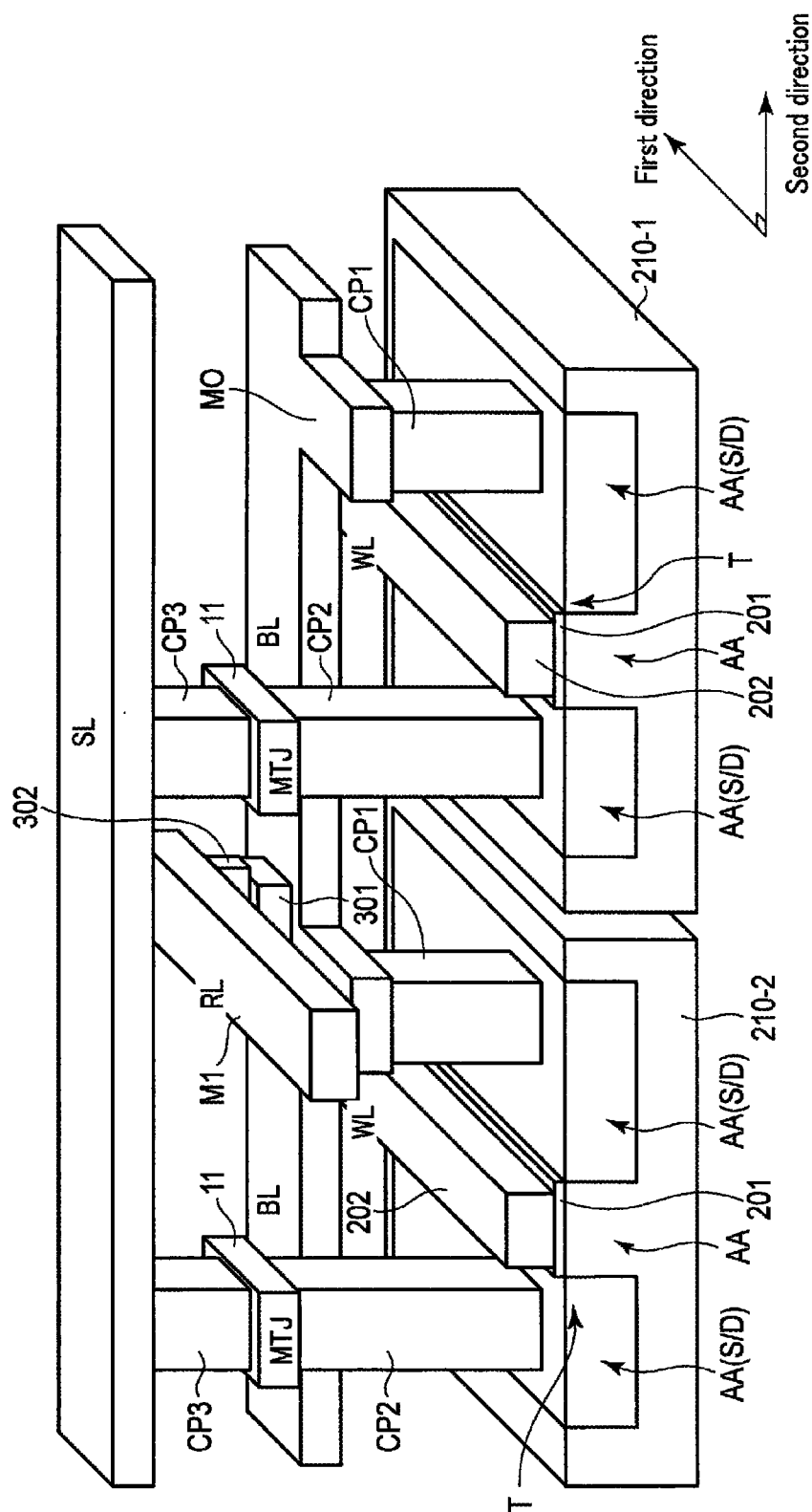
F I G. 3

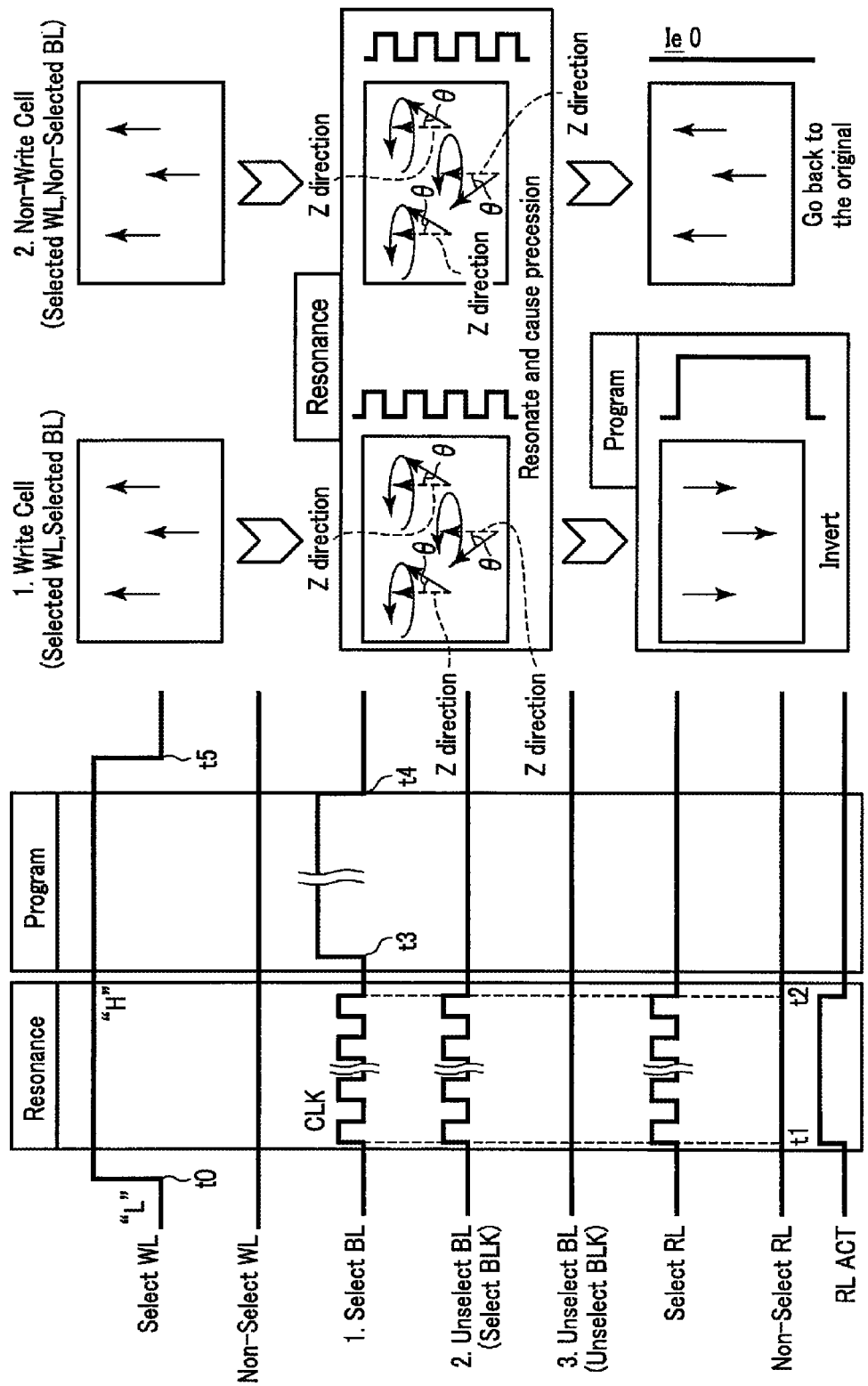

VARIABLE CHANGE MEMORY AND THE WRITING METHOD OF THE SAME

CROSS-REFERENCE TO RELATED APPLICATIONS

This application is a Continuation application of PCT Application No. PCT/JP2014/074755, filed Sep. 11, 2014 and based upon and claiming the benefit of priority from U.S. Provisional Application No. 61/952,649, filed Mar. 13, 2014 the entire contents of which are incorporated herein by reference.

FIELD

Embodiments described herein relate generally to a variable change memory capable of reducing a write current.

BACKGROUND

Examples of a variable change memory that stores data using a change in the resistance of a memory element are an MRAM (Magnetic Random Access Memory), an ReRAM (Resistive Random Access Memory), and a PCRAM (Phase-Change Random Access Memory).

Out of these variable change memories, an MRAM using a spin transfer torque writing method has been disclosed.

BRIEF DESCRIPTION OF THE DRAWINGS

FIG. 1 is a block diagram showing the arrangement of an MRAM according to an embodiment;

FIG. 2 is a plan view of a memory cell array according to the embodiment;

FIG. 3 is a sectional view of the memory cell array taken along a line III-III' in FIG. 2;

FIG. 8A is a timing chart showing the write operation according to the embodiment; and FIG. 8B and FIG. 8C are conceptual views showing the transition of the magnetization direction of the storage layer in write operation.

DETAILED DESCRIPTION

Figure 4:
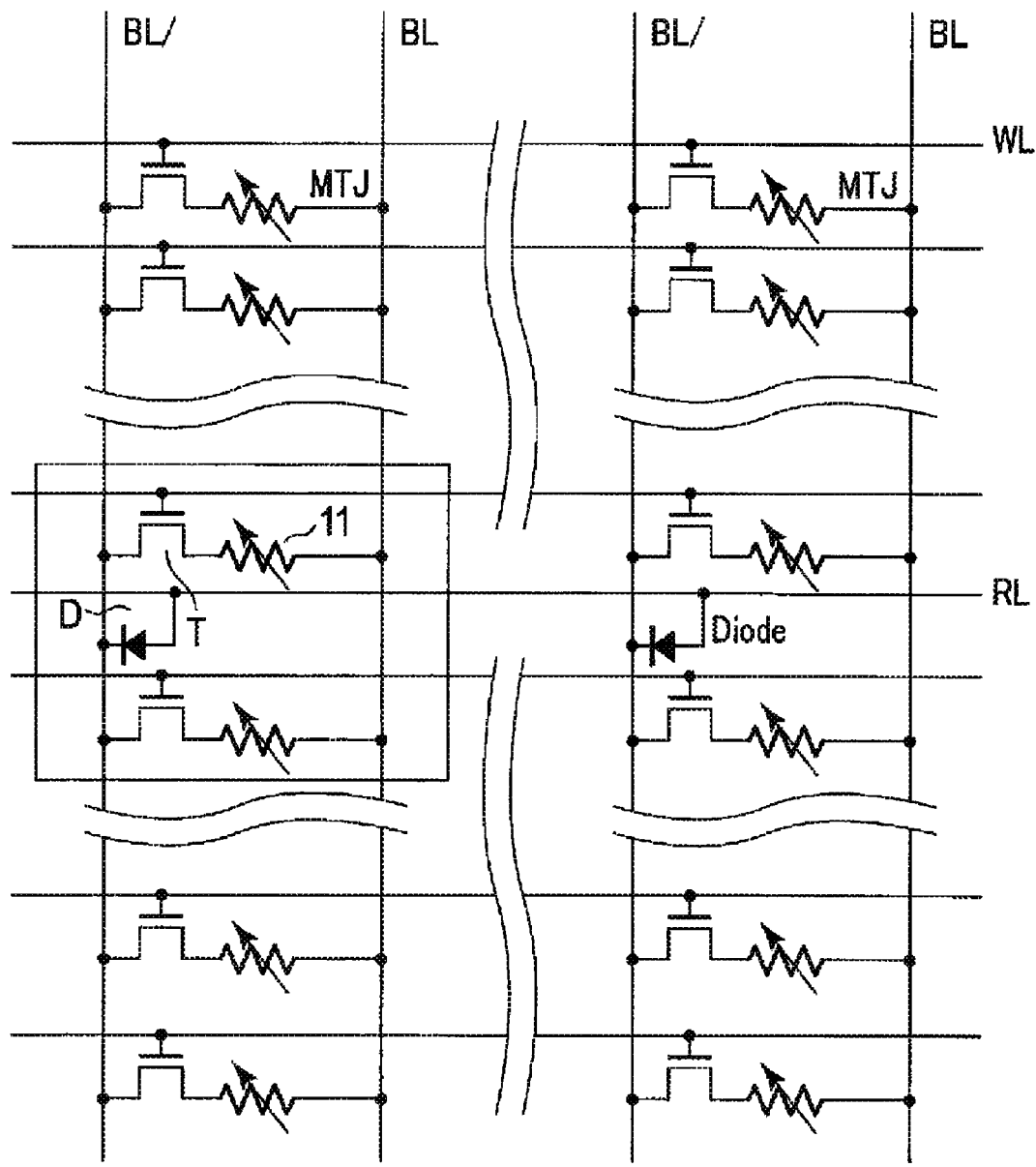
FIG. 4 is a circuit diagram showing an equivalent circuit of the memory cell array according to the embodiment.

In general, according to one embodiment, a variable change memory comprising: a bit line extending in a first direction; a word line extending in a second direction crossing the first direction; a memory cell array including a plurality of blocks each including memory cells, the memory cells each including a select transistor and a variable resistive element which stores different data depending on a change in a resistance value, the variable resistive element having one end connected to the bit line and the other end connected to a drain of the select transistor, and the select transistor having the drain, a source connected to a source line and a gate connected to the word line; a resonance line connected to the bit line and arranged to be substantially symmetrical in the memory cell array; a clock generator arranged in the memory cell array so that the blocks and the resonance line is arranged to be substantially symmetrical and which applies a voltage which oscillates at a predetermined period to the resonance line; and a write driver which supplies a write current to the bit line, wherein the voltage which oscillates at the predetermined period and the write current are supplied to the bit line.

An embodiment will now be described with reference to the accompanying drawings. Note that the drawings are merely schematic or conceptual, and the dimensions and ratios in the drawings do not necessarily match those of actuality. Even when the drawings illustrate identical portions, their dimensions or ratios may be different from each other. In particular, several embodiments to be described below exemplify apparatuses and methods to embody the technical concept. The technical concept is not limited by the shapes, structures, arrangements, and the like of the components. Various changes and modifications can be made for the technical concept without departing from the scope. Note that in the following explanation, the same reference numerals denote elements having the same functions and arrangements, and a repetitive explanation will be made only when necessary.

First Embodiment

As a variable change memory, memories of various types including an MRAM (Magnetic Random Access Memory), an ReRAM (Resistive Random Access Memory), and a PCRAM (Phase-Change Random Access Memory) are usable.

In this embodiment, an MRAM will be exemplified as a variable change memory. The MRAM includes an MTJ (Magnetic Tunnel Junction) element using a magnetoresistive effect as a memory element.

1. <Example of Overall Arrangement>

FIG. 1 is a block diagram showing the arrangement of an MRAM 100 according to the first embodiment.

The MRAM 100 includes a memory cell array 110, a row decoder 120, a column selection circuit 130, a column decoder 140, a sense amplifier 150, a write driver 160, an address buffer 170, and a control signal buffer 180.

The memory cell array 110 is formed by arraying memory cells MC each including an MTJ element (magnetoresistive element) 11 in a matrix. The memory cell array 110 includes n-1 word lines WL1 to WLn each extending in the Y direction, and m-1 bit lines BL1 to BLm each extending in the X direction crossing the Y direction, where n and m are natural numbers.

The row decoder 120 is connected to the word lines WL1 to WLn. The row decoder 120 selects one of the n-1 word lines WL in a selected block BLK based on a row address RA.

A selection circuit 120-1 is provided in the row decoder 120 (not illustrate). The selection circuit 120-1 will be described later.

A voltage generator 120-2 generates a write current Iw and a select voltage.

The sense amplifier (read circuit) 150 and the write driver (write circuit) 160 are connected to the bit lines BL1 to BLm via the column selection circuit 130.

The column selection circuit 130 includes, for example, NMOSFETs (Metal Oxide Semiconductor Field Effect Transistors) in a number corresponding to the bit lines BL1 to BLm, and selects the bit lines BL necessary for an operation in accordance with an instruction from the column decoder 140.

The column decoder 140 decodes a column address CA and sends the decoded signal to the column selection circuit 130.

The sense amplifier 150 detects data stored in a selected memory cell based on a read current I flowing to the selected memory cell that is a read target. The data read by the sense amplifier 150 is externally output via an input/output buffer (I/O buffer) 190.

The write driver 160 externally receives write data via the I/O buffer 190. The write driver 160 supplies the write current Iw to the bit line BL, thereby writing predetermined data in a selected memory cell that is a write target.

The address buffer 170 externally receives an address ADD. The address buffer 170 sends the row address RA to the row decoder 120 and the column address CA to the column decoder 140.

The control signal buffer 180 externally receives a control signal and sends it to the sense amplifier 150 and the write driver 160. This control signal includes a write command CMD or the like.

The I/O buffer 190 sends/receives read data/write data to/from outside.

A controller 200 controls the entire MRAM 100. More specifically, the controller 200 executes an operation sequence such as a data write operation based on the address ADD, command CMD, and data supplied from the address buffer 170, the control signal buffer 180, and the I/O buffer 190.

To execute the sequence, the controller 200 controls the operation of each circuit block included in the MRAM 100.

In this embodiment, the controller 200 controls the timing to supply the write current Iwrite (to be referred to as Iw hereinafter) and a clock CLK (to be described later) to the memory cell MC via the bit line BL.

2. <Plan View of Memory Cell Array 110>

The memory cell array 110 will be described next with reference to FIG. 2. FIG. 2 is a plan view of the memory cell array 110.

As shown in FIG. 2, the memory cell array 110 includes a plurality of blocks BLK. In this embodiment, for example, a layout that divides one original block BLK into 16 blocks is employed. The 16 divided blocks will be referred to as blocks BLK0 to BLK15. Note that when the blocks BLK0 to BLK15 are not discriminated, they will simply be referred to as the blocks BLK.

As shown in FIG. 2, the sense amplifier 150, the column decoder 140 (Y-Dec in FIG. 2), and the row decoder 120 (X-Dec in FIG. 2) are arranged around, for example, the block BLK0.

That is, the memory cell MC in the block BLK is selected by the column decoder 140 and the row decoder 120.

In the memory cell array 110, resonance lines RL (RL in FIG. 2), buffers BF, and a clock generator 210 (CLK generator in FIG. 2) are provided.

The clock generator 210 is arranged at the center of the memory cell array 110.

The resonance lines RL are arranged to be bilaterally or vertically symmetrical to each other on the memory cell array 110 with respect to the clock generator 210 as the center.

More specifically, resonance lines RL1, RL2, RL1-1-1, RL1-1-2, RL1-2-1, RL1-2-2, RL2-1-1, RL2-1-2, RL2-2-1, and RL2-2-2 are arranged to be vertically symmetrical to each other sequentially outward from the clock generator 210 as the center. Resonance lines RL1-1, RL1-2, RL2-1, RL2-2, and RL3-1 to RL3-8 are arranged to be bilaterally symmetrical to each other.

The buffer BF is connected to a distal end of each resonance line RL.

For example, the clock CLK output from the clock generator 210 and passed through the resonance line RL1 undergoes waveform shaping by the buffer BF provided at the distal end of the resonance line RL1 and the clock CLK is then distributed to the resonance lines RL1-1 and RL1-2.

After that, the clock CLK passed through the resonance line RL1-1 undergoes waveform shaping by the buffer BF provided at the distal end of the resonance line RL1-1 and the clock CLK is then distributed to the resonance lines RL1-1-1 and RL1-1-2.

Finally, the clock CLK passed through, for example, the resonance line RL1-1-1 undergoes waveform shaping by the buffer BF and is then distributed to the resonance line RL1-3 and supplied to the bit line BL extending through the block BLK0 via a diode D.

The clock CLK from the clock generator 210 is distributed to the remaining resonance lines RL in the same way, and a description thereof will be omitted.

3. Sectional View of Memory Cell Array 110

The sectional view of the memory cell array 110 will be described next with reference to FIG. 3. FIG. 3 is a sectional view of a region surrounded by the dotted line in FIG. 2.

As shown in FIG. 3, a transistor T is formed on a semiconductor substrate 210-1. More specifically, an active region AA is formed in the surface of the semiconductor substrate 210-1. An insulating film 201 and a metal interconnection layer 202 along the first direction are formed on the active region AA. A predetermined amount of impurity ions are implanted into the active regions AA located on both sides of the insulating film 201. The active regions AA thus function as the drain and source of the transistor T. The metal interconnection layer 202 functions as the word line WL.

More specifically, when a voltage is applied to the word line WL, a channel is formed in the active region AA immediately under the insulating film 201 so as to electrically connect the drain and source.

A contact plug CP1 is further formed, which has the bottom surface connected to the active region AA and the upper surface connected to a metal interconnection layer M0. The metal interconnection layer M0 is further connected to the bit line BL along the second direction.

An n-type semiconductor layer 301 is formed on the upper surface of the bit line BL, and a p-type semiconductor layer 302 is formed on it. The semiconductor layers 301 and 302 are combined to form the diode D.

An metal interconnection layer M1 having the lower surface in contact with the upper surface of the p-type semiconductor layer 302 is formed along the first direction. The metal interconnection layer M1 will be referred to as the resonance line RL hereinafter.

A contact plug CP2 is further formed, which has the bottom surface in contact with the other active region AA and the upper surface in contact with the bottom surface of the MTJ element 11.

The MTJ element 11 includes a storage layer, a tunnel barrier layer, and a reference layer sequentially from the lower side.

The storage layer (to be also referred to as a free layer hereinafter) is a ferromagnetic layer having a variable magnetization direction, and has a perpendicular magnetic anisotropy perpendicular or almost perpendicular to the film surface (upper surface/lower surface). "Variable magnetization direction" means that the magnetization direction changes for a predetermined write current. "Almost perpendicular" means that the direction of a residual magnetization falls within the range of $45°<\theta\leq90°$ with respect to the film surface (this direction will be defined as a Z direction hereinafter).

As will be described later, when the clock CLK having a predetermined frequency (in other words, a current/voltage of a square wave) is supplied, the spins resonate, and the magnetization direction of the storage layer tilts by $\theta$ with respect to the Z direction. The frequency is about several GHz.

The tunnel barrier layer is formed on the storage layer, and the reference layer is formed on the tunnel barrier layer.

The tunnel barrier layer is a nonmagnetic layer and contains a nonmagnetic material such as MgO. However, the material is not limited to this, and the tunnel barrier layer may contain a metal oxide such as $Al_2O_3$, MgAlO, ZnO, or TiO.

The reference layer is a ferromagnetic layer having an unchangeable magnetization direction, and has a perpendicular magnetic anisotropy perpendicular or almost perpendicular to the film surface. "Unchangeable magnetization direction" means that the magnetization direction does not change for a predetermined write current. That is, the magnetization direction inverting energy barrier of the reference layer is larger than that of the storage layer.

A contact plug CP3 is formed, which has the bottom surface in contact with the upper surface of the MTJ element 11 and the upper surface connected to a source line SL (referred to as the bit line BL in FIG. 3).

Note that the clock CLK flows through resonance line RL=>diode D=>bit line BL=>metal interconnection layer M0, contact plug CP1=>active region AA (drain)=>active region AA (source)=>contact plug CP2=>MTJ element 11=>contact plug CP3=>source line SL in this order.

Note that the transistor T formed on a semiconductor substrate 210-2 has the same arrangement as described above, and a description thereof will be omitted.

4. Equivalent Circuit

An equivalent circuit of the memory cell array 110 will be described next with reference to FIG. 4. FIG. 4 is a circuit diagram focusing on, for example, the block BLK0. This will be described below focusing on a region corresponding to the above-described sectional view. The above-described sectional view corresponds to part of a region surrounded by the thick line in FIG. 4.

Focus will be placed on the memory cell MC surrounded by the dotted line below.

One end of the MTJ element 11 is connected to, for example, the bit line BL, and the other end of the MTJ element 11 is connected to the drain of the select transistor T. The source of the select transistor T is connected to, for example, the source line SL (BL/ in FIG. 4), and the gate of the select transistor T is connected to the word line WL.

The memory cells MC each including the MTJ element 11 and the select transistor T are arranged in a matrix.

The above-described resonance line RL is arranged in parallel to the word line WL. The diode D having the anode connected to the resonance line RL and the cathode connected to the bit line BL is formed.

That is, as described above, the clock CLK flows from the resonance line RL to the bit line BL and then from the transistor T to the MTJ element 11 included in the memory cell MC.

5. Block BLK Selection Circuit 5-1. Circuit Diagram

The selection circuit 120-1 will be described next with reference to FIG. 5A. The selection circuit 120-1 selects the block BLK, and supplies a write voltage and the clock CLK to the word lines WL in the selected block BLK and the bit lines BL and the resonance lines RL provided in the selected block BLK.

Figure 5A:
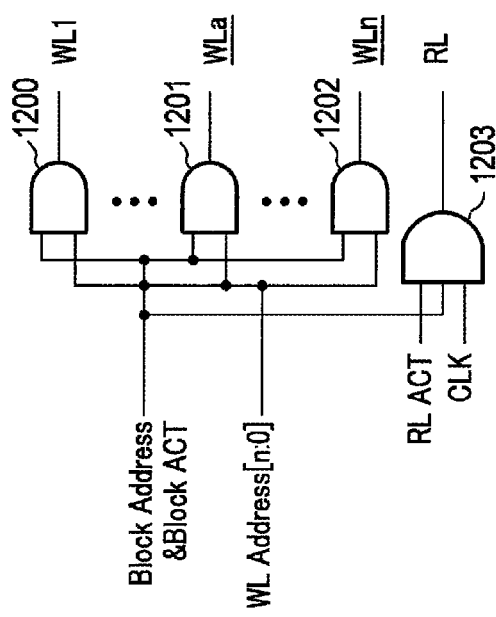
FIG. 5A is a block diagram of a selection circuit according to the embodiment.

As shown in FIG. 5A, the selection circuit 120-1 includes AND circuits 1200 to 1203.

The AND circuit 1200 performs an AND operation of Block Address & Block ACT and WL Address[n:0] and supplies the AND result to the word line WL1.

This also applies to the AND circuits 1201, 1202.

The AND circuit 1203 performs an AND operation of the signal Block Address & Block ACT, a signal RL ACT, and the clock CLK and supplies the AND result, that is, the signal RL to the resonance line RL.

Note that although the selection circuit 120-1 uses AND circuits for the sake of simplicity, the circuits are not limited to those. More specifically, the selection circuit 120-1 may be implemented using NAND circuits or NOR circuits.

5-2. Timing Chart

Figure 5B:
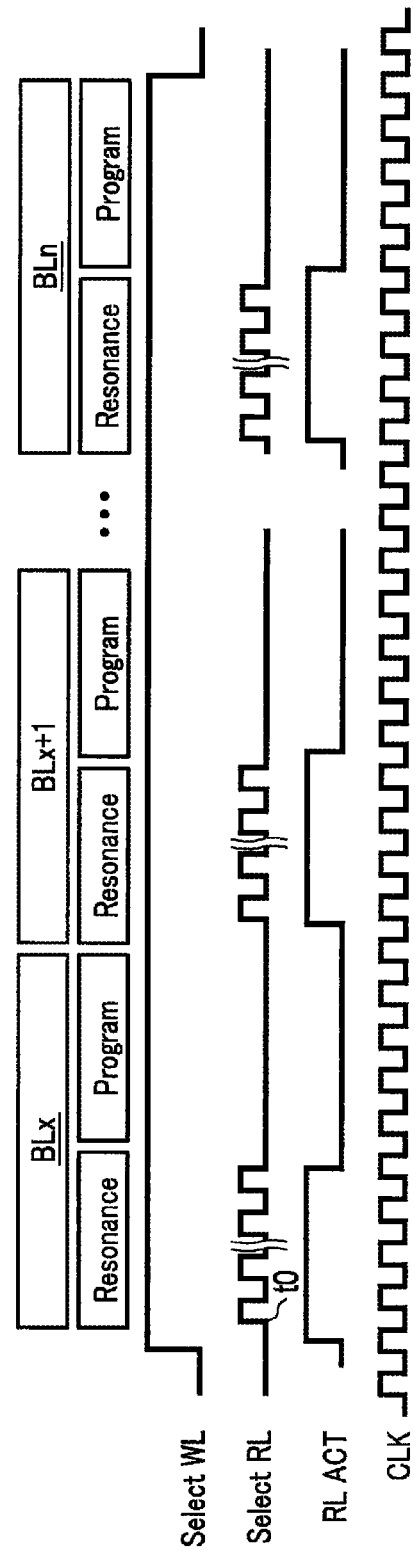
FIG. 5B shows timing charts at the time of resonant motion according to the embodiment.

The operation of each signal supplied from the selection circuit 120-1 will be described next with reference to FIG. 5B. FIG. 5B shows timing charts of the voltage levels of the signals before the write current Iw is supplied. Note that FIG. 5B shows timing charts for bit lines BLx, BLx+1, ..., BLm. Focus will be placed on the bit line BLx below. Note that the timing charts simultaneously progress in the bit lines BLx, BLx+1, ..., BLm.

The ordinate represents the selected word line WL, selected resonance line RL, signal RL ACT, and clock CLK, and the abscissa represents time t.

In addition, as shown in FIG. 5A, when the clock CLK, the signal Block BLK Address & Block ACT, and the signal RL ACT change to "H" level, the signal RL changes to "H" level.

That is, as shown in FIG. 5B, at time t0, the voltage level of the selected resonance line RL repetitively changes to "H" and "L" in synchronism with the clock CLK.

Note that although the above description has been done focusing on resonant motion, the voltage level of the selected word line WL is "H" throughout the write operation.

6. Characteristic of MTJ Element 11

The characteristic of the MTJ element 11 will be described next with reference to FIGS. 6A, 6B, and 6C. Place focus on a magnetization in the storage layer for the descriptive convenience.

Figure 6A:
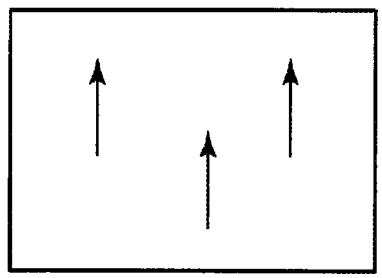
FIGS. 6A, 6B, and 6C are conceptual views showing the characteristic of an MTJ element according to the embodiment.

FIG. 6A is a conceptual view showing a state in which the magnetization in the storage layer is in a parallel state with respect to the magnetization in the reference layer. FIG. 6B is a conceptual view of resonant motion of spins. FIG. 6C is a conceptual view showing a state in which the magnetization in the storage layer has transited to an anti-parallel state with respect to the magnetization in the reference layer due to supply of the write current Iw.

As shown in FIG. 6A, the clock CLK having a predetermined frequency (for example, several ten GHz) is supplied to the magnetization in the parallel state, for example, from the reference layer side to the storage layer.

Figure 6B:
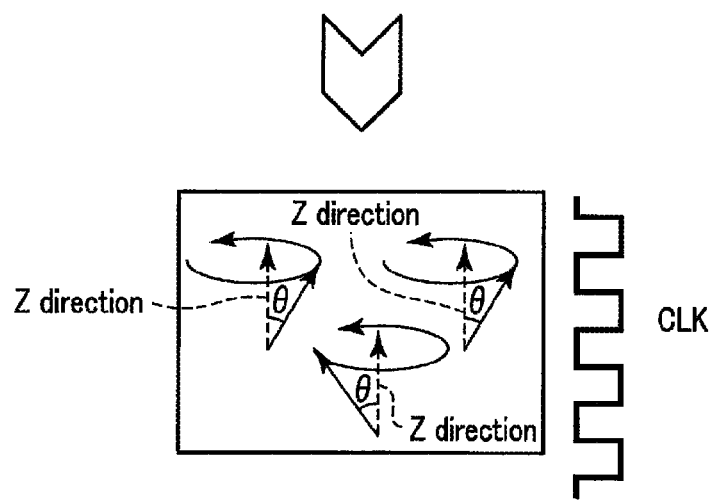
Figure 6C:
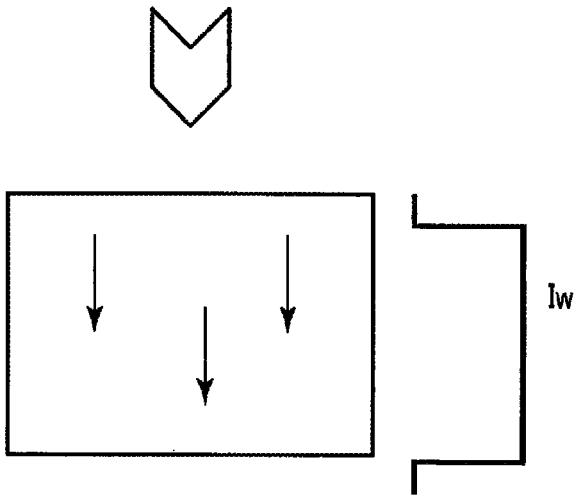

Then, as shown in FIG. 6B, the spins in the storage layer resonate with the clock CLK, and as a result, rotate while tilting by $\theta$ with respect to the Z direction.

This phenomenon will quantitatively be explained. The tilt θ of spins in the storage layer is obtained by $$g(\theta)=[-4+(P^{-1/2}+P^{1/2})^3(3+\hat{s}_2\cdot\hat{s}_1)/4]^{-1} \quad (1)$$

$$\hat{s}_2\cdot\hat{s}_1=AB\cos\theta \quad (2)$$

where P: polarized ratio, S2, S2: total angular momentum vectors of storage layer and reference layer (caret added on S1 and S2 indicates a unit vector), A, B: sizes of vectors S1 and S2.

Note that when the magnetization direction of the storage layer is the same as that of the reference layer, no polarization occurs, and P=0. If the magnetization direction of the storage layer is inverted, polarization occurs, and P=1.

When the clock CLK is supplied to the storage layer at P=1, the spins tilt by $\theta=\pi/3$ with respect to the Z direction.

For example, when the value θ is substituted into equations (1) and (2), we obtain $g(\theta=\pi/3)=\frac{1}{3}$. In this case, A=B=1.

When the clock CLK is not supplied to the storage layer, the magnetization direction of the spins in the storage layer is parallel to the Z direction, that is, θ=0. When this value is substituted into equations (1) and (2), we obtain $g(\theta=0)=\frac{1}{4}$. In this case, A=B=1.

Using the value g that changes depending on the value θ, the write current Iw used to change the inverted magnetization direction of the storage layer to a noninverted state with respect to the fixed layer is obtained by $$I_w=-e(VM_s/\mu_B)\alpha\gamma[H_{ext}+(H_{ani}\pm M_s)/2]/g(\theta) \quad (3)$$

where V: volume of storage layer (free layer), Ms: saturated magnetization of storage layer, $\mu_B$: Bohr magneton, Hext: externally-applied magnetic field, Hani: equal to Hc.

For example, when $g(\theta=0)=\frac{1}{4}$, equation (3) is rewritten as $$I_w(\theta=0)=-e(VM_s/\mu_B)\alpha\gamma[H_{ext}+(H_{ani}\pm M_s)/2]\cdot 4 \quad (4)$$

For example, when $g(\theta=\pi/3)=\frac{1}{3}$, equation (3) is rewritten as $$I_w(\theta=\pi/3)=-e(VM_s/\mu_B)\alpha\gamma[H_{ext}+(H_{ani}\pm M_s)/2]\cdot 3 \quad (5)$$

From equations (4) and (5), we obtain $$3I_w(\theta=0)=4I_w(\theta=\pi/3) \quad (6)$$

Hence, we obtain $$I_w(\theta=\pi/3)=\tfrac{3}{4}I_w(\theta=0) \quad (7)$$

That is, the value of the write current Iw used to change the magnetization direction to the noninverted state in a state in which the spins in the storage layer tilt by $\theta=\pi/3$ with respect to the Z direction can be ¾ the value of the write current Iw supplied in a state in which the spins in the storage layer are parallel to the Z direction, that is, tilt by θ=0.

7. Write Operation (Flowchart)

Figure 7:
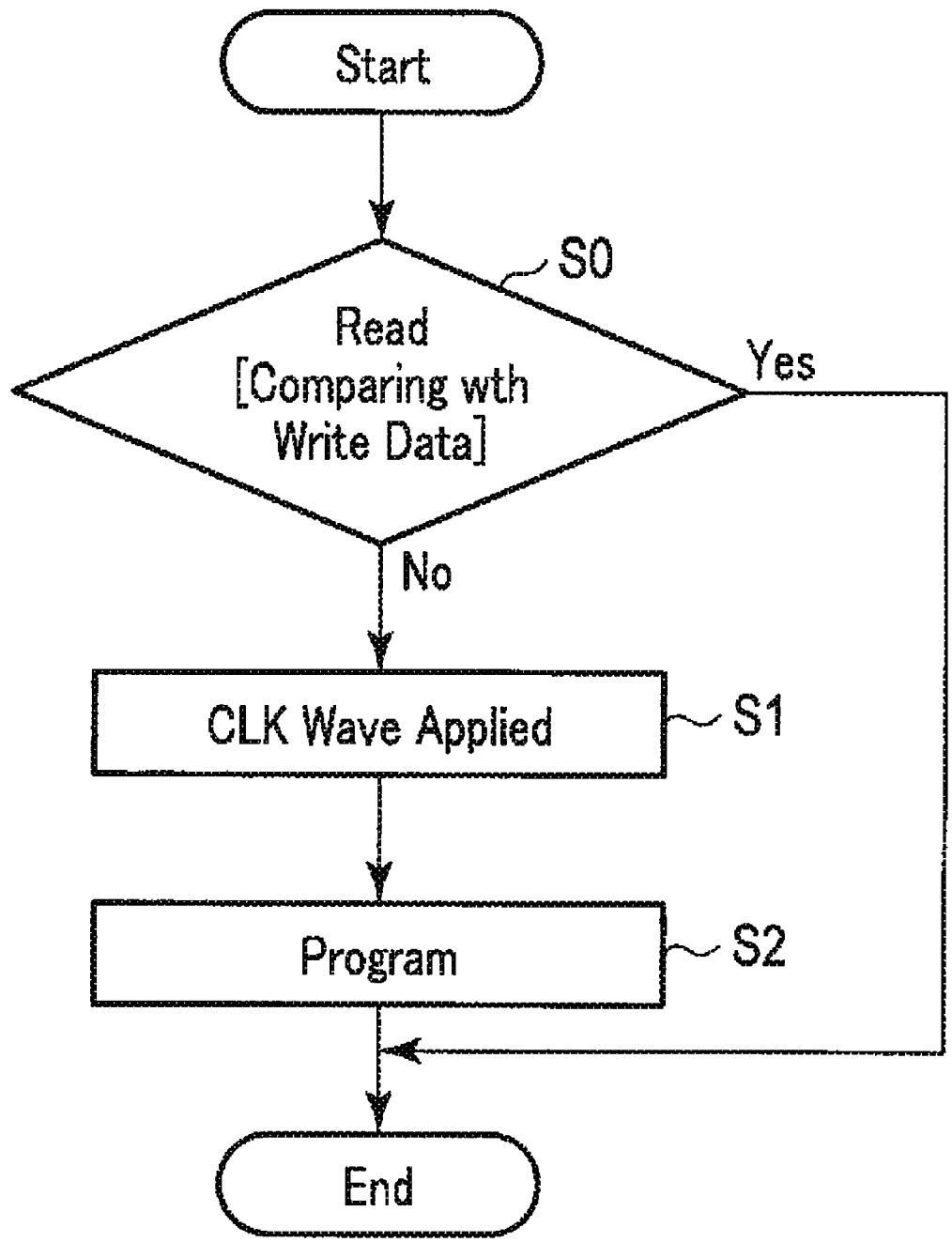
FIG. 7 is a flowchart showing the write operation of the memory cell array according to the embodiment.

The write operation will be described next with reference to FIG. 7. FIG. 7 is a flowchart showing a write operation according to this embodiment. Note that the write operation is controlled by the controller 200.

As shown in FIG. 7, first, a read operation is executed before a write operation, and it is determined whether the magnetization in the storage layer faces the same direction as write data (step S0).

If the data to be written now is already implemented by the magnetization direction of the storage layer (YES in step S0), the controller 200 determines that the write current Iw need not be supplied to the MTJ element 11, and ends the write operation.

On the other hand, if the data to be written now faces the direction reverse to the magnetization direction of the storage layer (NO in step S0), the controller 200 executes the write operation.

More specifically, the controller 200 instructs the clock generator 210 to generate the clock CLK, and controls to supply the generated clock CLK to the selected memory cell MC in the selected block BLK via the resonance line RL (step S1). At this time, the select voltage (for example, voltage VDD=1.8 V) generated by a voltage generation circuit 120-2 is applied to the selected word line WL.

The MTJ element 11 of the selected memory cell MC is thus caused to resonate, and the spins in the storage layer are tilted by θ with respect to the Z direction.

Next, the controller 200 instructs the voltage generation circuit 120-2 to generate the write current Iw, and supplies the generated write current Iw to the bit line BL extending through the selected block BLK (step S2).

In this way, the clock CLK and the write current Iw are supplied to the MTJ element 11 via the bit line BL, thereby executing the write operation.

Note that although the read operation is performed for the MTJ element in the flowchart, read data held by a buffer (not shown) may be read.

In this case, data can be recognized without directly performing the read operation for the MTJ element.

8. Write Operation (Timing Chart)

Changes in voltage levels of the signals in the write operation will be described next with reference to FIGS. 8A, 8B, and 8C.

FIG. 8A is a timing chart showing changes in voltage levels of the signals supplied to the selected block BLK in the write operation, and FIGS. 8B and 8C are conceptual views showing the transition of the magnetization direction of the storage layer in the above-described write operation.

Assume that the following signals are not supplied to unselected blocks BLK, although not illustrated here.

The ordinate represents the selected word line WL, unselected word line WL, selected bit line BL, unselected bit line BL (in a selected block), unselected bit line BL (in an unselected block), selected resonance line RL, and unselected resonance line RL, and the abscissa represents time t.

At time t0, the controller 200 controls the voltage generation circuit 120-2 to generate the select voltage to the selected word line WL. Hence, the voltage level of the selected word line WL is "H" from time t0.

At time t1, the controller 200 controls to supply the clock CLK to the selected resonance line RL. More specifically, the signal RL ACT is changed to "H" level. The clock CLK that then passes through the diode D is thus supplied to the bit line BL.

That is, the clock CLK is supplied to the selected bit line BL and unselected bit line BL from time t1. The clock CLK is then supplied to the MTJ element 11.

For this reason, the spins in the storage layer tilt by θ with respect to the Z direction, as shown in FIGS. 8B and 8C. In other words, this causes big precession at a large angle as compared to a case without resonant motion.

After that, at time t2, the controller 200 changes the signal RL ACT to "L" level, thereby stopping supplying the clock CLK to the selected bit line BL (select BL in FIG. 8A). Note that the clock CLK is generated even after time t2, and supply to the selected bit line BL is stopped by the signal RL ACT (see FIG. 5).

At time t3, the controller 200 controls the voltage generation circuit 120-2 to supply the write current Iw to the selected bit line BL.

Hence, the magnetization direction of the storage layer of the MTJ element 11 connected to the selected bit line BL is inverted, as shown in FIG. 8B.

However, since the write current Iw does not flow to the unselected bit line BL, as shown in FIG. 8C, the magnetization in the storage layer of the MTJ element 11 connected to the unselected bit line BL faces the original direction.

The write in the MTJ element 11 is ended by the operation from time t0 to t4. Hence, at time t5, the controller 200 controls the voltage generation circuit 120-2 to stop the select voltage supplied to the selected word line WL.

Note that the time difference between time t2 and t3 is preferably small. For example, time t2=time t3 may hold, or the times may overlap. When time t2 and time t3 overlap, the clock CLK and the write current Iw, which overlap, are supplied to the MTJ element 11. In addition, the operation from time t1 to t4 may be repeated several times.

A time $T_{CLK}$ at which the clock CLK is supplied to the bit line BL and a time $T_w$ at which the write current Iw is supplied to the bit line BL can have either a relationship $T_{CLK}<T_w$ or $T_{CLK}>T_w$.

The time difference between time t2 and t3 is preferably small, as described above, and vice versa. That is, the time difference between time t2 and t3 may be large.

The values of the clock CLK and the write current Iw will be described. Although not described with reference to FIGS. 8A to 8C, a maximum current value $I_{CLK\_MAX}$ of the clock CLK and a maximum current value $I_{w\_MAX}$ of the write current Iw can have either a relationship $I_{CLK\_MAX}<I_{w\_MAX}$ or $I_{CLK\_MAX}>I_{w\_MAX}$.

Note that the clock CLK need not always be a positive voltage and may be a positive/negative voltage like an alternating voltage. In general, the clock CLK can be a voltage (only positive, only negative, or including both positive and negative) that oscillates at a predetermined period.

Effects of this Embodiment

The variable change memory according to this embodiment can decrease the value of the write current Iw.

This is because in this embodiment, a current having a certain frequency is supplied to the storage layer to make the spins in the storage layer resonate and tilt with respect to the Z direction.

That is, the value of the tilt θ of the spins with respect to the Z direction is changed, as indicated by equation (7), thereby making the value of the write current Iw smaller than in a case where θ=0.

In addition, the variable change memory according to this embodiment can maintain the waveform (square wave) of the clock CLK having a certain frequency.

This is because (1) the block BLK of the memory cell array 110 is divided into a plurality of blocks, (2) the clock generator 210 is arranged at the center of the memory cell array 110, (3) the resonance lines RL having the same length are arranged to be bilaterally symmetrical to each other with respect to the clock generator 210, and (4) the buffer BF is provided at the output end of each resonance line RL.

That is, since the clock CLK output from the clock generator 210 is symmetrically distributed, the clock CLK having a shaped waveform can be supplied to the bit line BL without causing a reflected wave from one resonance line RL to the other resonance line RL which are arranged to be bilaterally symmetrical to each other.

Furthermore, since the block BLK is divided, the length of the bit line BL in each block BLK is shortened. Hence, the clock CLK having a shaped waveform can propagate through the near and far sides of the bit line BL.

Note that the frequency used in this embodiment has a value such as 1 GHz or 10 GHz. However, the frequency is not limited to this as long as the spins resonate and cause precession.

In each of the described-above embodiments, an MRAM may be an STT-MRAM (spin-transfer torque magnetoresistive random access memory) using a spin transfer torque writing method in an inversion of a magnetization (spin) of a magnetic layer.

In the above-described embodiments, the MRAM using a magnetoresistive effect element as a variable resistive element has been exemplified as a variable change memory (semiconductor memory device). However, the variable change memory according to each of above-described embodiments is not limited to the MRAM. Each of above-described embodiments is able to apply to various kinds of semiconductor memories including a memory element capable of storing (holding) data and reading the data based on a change in a resistance of the memory element by a supplying an electric current or a voltage and the like.

Furthermore, each of above-described embodiments is able to apply to a variable resistance change memory similar to MRAM, such as an ReRAM (resistive random access memory), or a PCRAM (phase change random access memory).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A writing method of a memory having a memory cell including an MTJ element, comprising:
    applying a voltage which oscillates at a predetermined period to the MTJ element; and
    applying, to the MTJ element, a predetermined voltage higher than a peak voltage of the voltage which oscillates at the predetermined period after the voltage which oscillates at the predetermined period is applied to the MTJ element.

2. The writing method of the memory according to claim 1, wherein:
    one end of the MTJ element is connected to a bit line,
    the other end of the MTJ element is connected to one end of a select transistor,
    the other end of the select transistor is connected to a source line, and
    the voltage which oscillates at the predetermined period and the predetermined voltage are applied from a side of the bit line to the MTJ element.

3. The writing method of the memory according to claim 1, wherein the predetermined period is not less than 1 GHz.

4. The writing method of the memory according to claim 1, wherein the predetermined period is not less than 10 GHz.

5. The writing method of the memory according to claim 1, wherein an application time of the voltage which oscillates at the predetermined period is shorter than the application time of the predetermined voltage.

6. The writing method of the memory according to claim 5, wherein the voltage that oscillates at the predetermined period is superimposed on the predetermined voltage at a start of application of the predetermined voltage.

* * * * *